(12) United States Patent
Lee

(10) Patent No.: US 6,605,989 B2
(45) Date of Patent: Aug. 12, 2003

(54) FM DEMODULATOR USING A SINGLE INPUT SIGNAL

(75) Inventor: Ching-Feng Lee, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/023,836

(22) Filed: Dec. 21, 2001

(65) Prior Publication Data
US 2003/0098743 A1 May 29, 2003

(30) Foreign Application Priority Data
Nov. 28, 2001 (TW) ........................... 90129369 A

(51) Int. Cl.[7] ................................. H03D 3/00
(52) U.S. Cl. ........................ 329/315; 329/327
(58) Field of Search .................. 329/315, 327; 327/238, 254; 360/30; 455/42, 205, 214, 215, 313, 323, 337

(56) References Cited

U.S. PATENT DOCUMENTS 4,618,967 A * 10/1986 Vance et al. ................. 375/324

* cited by examiner

*Primary Examiner*—David C. Mis
(74) *Attorney, Agent, or Firm*—Nath & Associates PLLC; Harold L. Novick

(57) ABSTRACT

A FM demodulator using a single input signal has two I-Q splitters with constant group delay apparatuses. During operation, t two I-Q splitters with constant group delay apparatuses may receive the input modulated signal to generate not only one pair of modulated and respectively delay $\tau_1$ and $\tau_2$ in phase signals but also another pair of modulated and respective delay $\tau_1$ and $\tau_2$ quadrature signals. These signals are used to demodulate the final demodulated signal.

30 Claims, 5 Drawing Sheets

FM DEMODULATOR USING A SINGLE INPUT SIGNAL

FIELD OF THE INVENTION

The present invention relates to a demodulation circuit, and more particularly relates to an apparatus using a single input signal and integrating all demodulation devices therein.

BACKGROUND OF THE INVENTION

Wireless communication uses electromagnetic waves as the medium to send a signal (data). This use of electromagnetic waves to carry a signal (data) is called a modulation process. Conversely, retrieving data from an electromagnetic wave is called demodulation. An electromagnetic wave that carries a signal is called a carrier wave and the signal thus carried is called a signal wave or a modulating wave. A modulated carrier wave is called a "modulated wave". There are three methods of modulation, the "amplitude modulation method", the "frequency modulation method", and the "phase modulation method".

This means that the frequency of the carrier wave changes according to the frequency of the modulating wave in the frequency modulation method. For example, assuming that the signal of the carrier wave is Vc and the signal of the modulating wave is Vs, the frequency modulation wave $V_{FM}$ is as follows:

$$v_c = \epsilon_c \sin \omega t (\omega = 2\pi f)$$

$$v_s = \epsilon_s \cos pt (p = 2\pi f)$$

$$v_{FM}(t) = \epsilon_c \sin(\omega t = \beta_F \sin pt)$$

where $\beta_F$ is the index of the frequency modulation.

The frequency modulation method shifts the original frequency value of carrier wave by a value proportional to the frequency of the modulating wave. The process of drawing the modulating wave Vs out from the frequency modulation wave $V_{FM}$ is called frequency demodulation. Reference is made to FIG. 1, a schematic drawing of the demodulator 101 being used to demodulate the modulating wave from the frequency modulation wave.

Different demodulating methods can be used in the demodulator 101. For example, the frequency variation can be transferred to amplified variation, after which an amplified demodulation process is performed to draw out the modulating wave. Alternately, the frequency variation can be transferred to phase variation, after which a phase demodulation process is performed to draw out the modulating wave.

The conventional quadrature demodulator uses the second method to perform the demodulation process. Reference is now made to FIG. 2, a description of the demodulation process. Assuming that the frequency modulation wave is $V_{FM1}$, $$v_{FM1}(t) = \epsilon_1 \sin(\omega t + \beta_F \sin pt) = \epsilon_1 \sin \alpha$$

$$\alpha = wt + \beta_F \sin pt$$

The quadrature phase-shift apparatus 201 receives the frequency modulation wave $V_{FM1}$ and generates a quadrature output signal $V_{FM2}$:

$$v_{FM2}(t) = \epsilon_2 \sin(\alpha + \pi/2)$$

The two waves $V_{FM1}$ and $V_{FM2}$ are then multiplied together by the multiplier stage 202 to generate an output signal:

$$v_{FM1}(t) \times v_{FM2}(t) = \epsilon_1 \sin\alpha \times \epsilon_2 \sin(\alpha + \frac{\pi}{2}) = \epsilon_1 \sin\alpha \times \epsilon_2 \cos\alpha = \frac{1}{2}\epsilon_1\epsilon_2\sin 2\alpha$$

From the foregoing description, the phase of the output signal demodulated by the conventional quadrature demodulator gives rise to a second order frequency component (2α). Therefore, it is necessary to uses the low pass filter 203 to eliminate the second order frequency component.

However, the foregoing method has a major drawback. An output wave having the second order frequency component (2α) is generated in the phase when the two waves $V_{FM1}$ and $V_{FM2}$ are input into the multiplier stage 202. Therefore, a high quality low pass filter 203 is needed in the conventional demodulator circuit to eliminate the second order frequency component (2α). The low pass filter 203 must be highly selective because the second order frequency component (2α) is very close to the required frequency α of the low pass filter 203 is required. The high selectivity means that the slope of the frequency response curve is high. Therefore, the low pass filter 203 and the demodulator circuit may not form an integrated circuit because the low pass filter 203 is composed of discrete devices.

FIG. 3 illustrates another demodulation method. The Philips company discloses the method in the U.S. Pat. No. 5,341,107. The in-phase (I) and quadrature (Q) modulated signals are input mutually into the complex circuit 301 to generate two modulated signals having time delay, respectively, in the phase ($I_d$) and quadrature ($Q_d$) signals. Then, the in phase and delay time modulated signal ($I_d$) and the quadrature modulated signal (Q) are multiplied together by the multiplier stage 302 to generate an output signal. At the same time, the quadrature and delay time modulated signal ($Q_d$) and the in phase modulated signal (I) are multiplied together by the multiplier stage 303 to generate an output signal. Then, the two output signals are subtracted from each other in the differential stage 304 to generate the modulating signal Vs.

Although the method provided by the Philips Company may integrate all demodulation devices including the low pass filter into one circuit, two modulated signals, in phase and quadrature ones, are necessary in the input terminals. Therefore, two circuits are needed to process the in phase and quadrature modulated signals at the same time before these two signals are received by the complex circuit 301. This will not only requires additional circuits but also consumes more power.

SUMMARY OF THE INVENTION

To resolve the forgoing problems, the main purpose of the present invention is to provide a new design demodulator that eliminates the second order frequency of demodulated signal. Therefore, use of a low pass filter having high selectivity to filter the frequency is no longer necessary. In other words, all demodulation devices and the low pass filter may be combined into an integrated circuit according to the present invention. Moreover, the demodulator of the present invention only requires one modulated input signal to perform the demodulating process. Therefore, only one circuit is required to handle the modulated signal before the demodulator begins to process the signal. This is not similar to Philips' invention that requires two circuits and so may save power.

The demodulator of the present invention comprises two, the first and the second, I-Q splitters with constant group delay apparatuses. When operated, the first I-Q splitter with constant group delay apparatus first receives the modulated input signal I and then generates two modulated output signals. One is modulated signal $I_{r1}$ which is in phase and has delay $\tau_1$ time compared with I and the other is modulated signal $Q_{\tau 1}$ which is in quadrature and has delay $\tau_1$ time compared with I. Then, the second I-Q splitter with constant group delay apparatus receives the modulated signal $I_{\tau 1}$ and generates two modulated output signals. One is modulated signal $I_{\tau 1+\tau 2}$ which is in phase and has a delay $\tau_2$ time compared with $I_{-1}$ and the other is modulated signal $Q_{\tau 1+\tau 2}$ which is in quadrature and has a delay $\tau_2$ time compared with $I_{\tau 1}$. Next, in phase and having delay $\tau_1$ time modulated signal $I_{\tau 1}$ and in quadrature and having delay $\tau_1+\tau_2$ time $Q_{\tau 1+\tau 2}$ are multiplied together by the first multiplier stage to generate an output signal. At the same time, in phase and having delay $\tau_1+\tau_2$ time modulated signal $I_{\tau 1+\tau 2}$ and in quadrature and having delay $\tau_1$ time modulated signal $Q_{\tau 1}$ are also multiplied together by the second multiplier stage to generate another output signal. Finally, the two output signals are subtracted from each other in the differential stage to demodulate the modulated signal I. It is noted that $\tau_1$ is the delay time of the first I-Q splitter with the constant group delay apparatus and $\tau_2$ is the delay time of the second I-Q splitter with the constant group delay apparatus.

Because the frequency of the signal demodulated by the demodulator of the present invention does not include the second order frequency, it is not necessary to use a low pass filter having high selectivity to filter the frequency. In other words, all demodulation devices and the low pass filter may be combined into an integrated circuit according to the present invention.

On the other hand, the demodulator of the present invention only requires one modulated input signal I to perform the demodulating process. Therefore, only one circuit is required to handle the modulated signal before the demodulator beginning to process the signal. This is different from Philips' invention requiring two circuits and so may save power.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Without limiting the spirit and scope of the present invention, the method proposed in the present invention is illustrated with one preferred embodiment of an FM demodulator using a single input modulated signal and not generating the second order frequency after demodulating. Skill artisans, upon acknowledging the embodiments, can apply the demodulator according to the present invention to any kind of demodulating circuit to eliminate the drawback existing in the conventional quadrature demodulator that will generate an output signal having the second order frequency component in the phase. This requires a high selectivity low pass filter. In other words, the low pass filter combined into an integrated circuit may not be attained. On the other hand, the demodulator of the present invention only requires one modulated input signal I to perform the demodulating process. Therefore, only one circuit is required to handle the modulated signal before the demodulator begins to process the signal, thus saving power. The application of the present invention need not be limited by the following embodiment.

This present invention provides a new design demodulator to eliminate the drawbacks existing in the conventional quadrature demodulator. The demodulator of the present invention requires only one modulated input signal to perform the demodulating process and the modulating signal does not have the second order frequency in its phase after the demodulating process. Therefore, the present invention may be achieved in one integrated circuit.

The demodulator of this present invention uses a single input modulated signal and two I-Q splitters with constant group delay apparatuses to generate one pair of modulated and respectively delay $\tau_1$ and $\tau_2$ in phase signals and the other pair of modulated and respectively delay $\tau_1$ and $\tau_2$ quadrature signals. These signals will be used to demodulate the input modulated signal.

Figure 1:
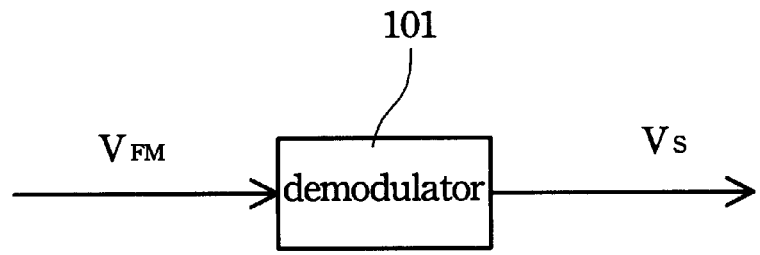
FIG. 1 illustrates a block diagram of a frequency demodulator to demodulate the modulated signal to modulating signal.
Figure 2:
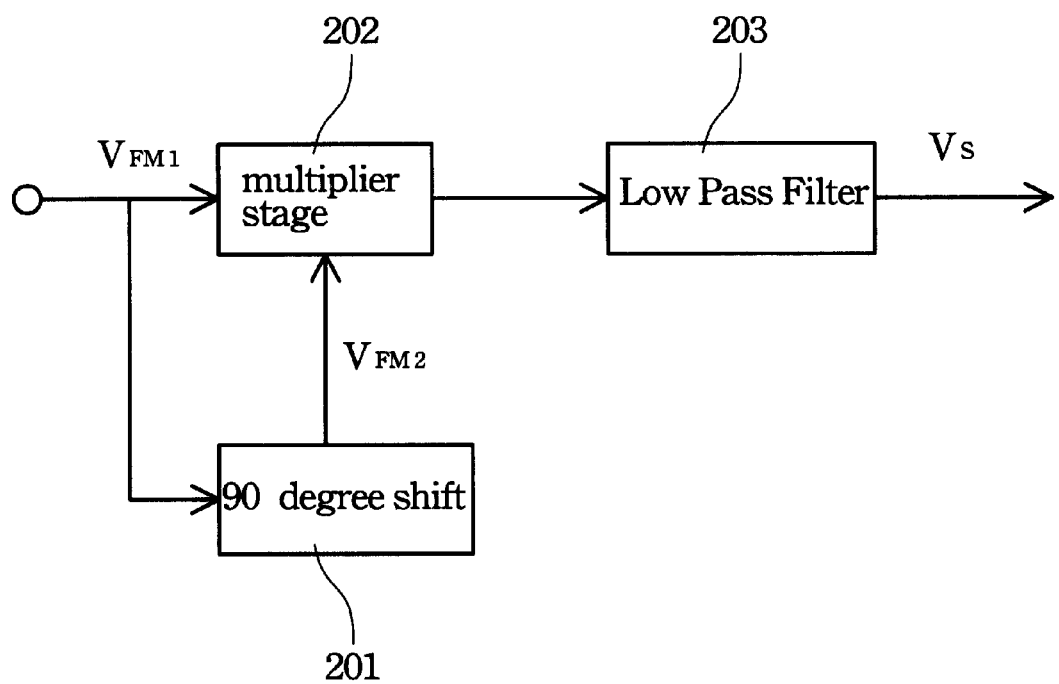
FIG. 2 illustrates a block diagram of the conventional quadrature demodulator to transfer the frequency variation to phase variation.
Figure 3:
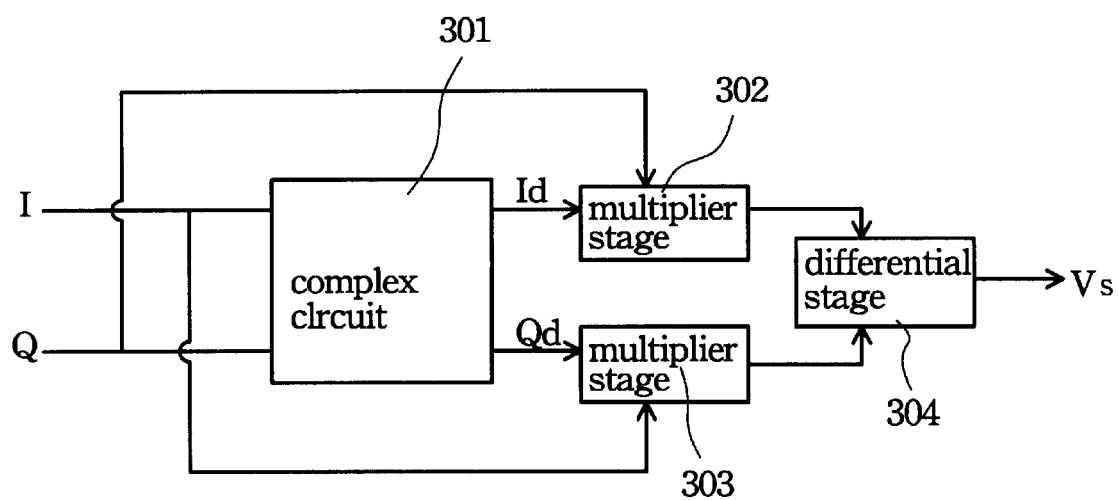
FIG. 3 illustrates a block diagram of the demodulator disclosed by Philips Company.
Figure 4A:
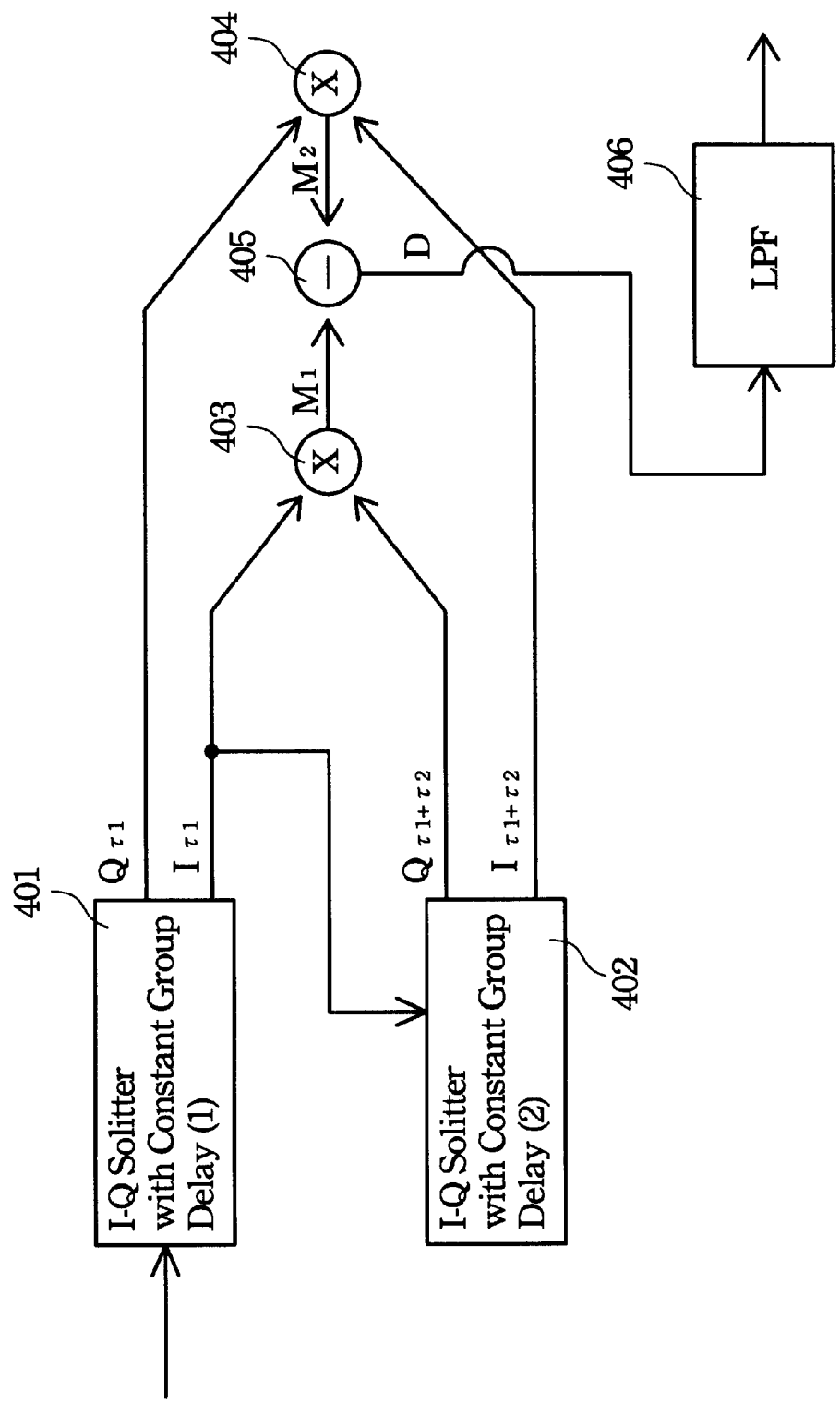
FIGS. 4 illustrates a block diagram of the demodulator disclosed by the present invention.

The framework diagram of the preferred embodiment of the present invention demodulator using a single input modulated signal I is illustrated in FIG. 4A. The demodulator of the present invention uses an I-Q splitter with a constant group delay apparatus to receive the single input modulated signal I to generate an in phase modulated signal having an interval of time delay and an in quadrature modulated signal having an interval of time delay. The demodulator of the present invention comprises two I-Q splitter with constant group delay apparatus 401 and 402, two multiplier stages 403 and 404, a differential stage 405, and a low pass filter 406. The two I-Q splitters with constant group delay apparatuses may receive the input modulated signal to generate not only one pair of modulated and respectively delay $\tau_1$ and $\tau_2$ in phase signals but also the other pair of modulated and respectively delay $\tau_1$ and $\tau_2$ quadrature signals. In other words, a modulated and an interval of time delay ($\tau_1$ or $\tau_2$) in phase signal and a modulated and an interval of time delay ($\tau_1$ or $\tau_2$) quadrature signal are generated after the input modulated signal is received by the I-Q splitter with constant group delay apparatuses 401 or 402. It is assumed that $\tau_1$ is the delay time of the first I-Q splitter with constant group delay apparatus and $\tau_2$ is the delay time of the second I-Q splitter with constant group delay apparatus.

It is assumed that "I" represents the single input modulated signal in accordance with the preferred embodiment of the present invention. A modulated signal $I_{\tau 1}$ which is in phase and has a delay $\tau_1$ time compared with I and a modulated signal $Q_{\tau 1}$ which is in quadrature and has a delay $\tau_1$ time compared with I are generated after the single input modulated signal I passes through the I-Q splitter with constant group delay apparatus 401. Then, the modulated signal $I_{\tau 1}$ passes through the I-Q splitter with constant group delay apparatus 402 again to generate two modulated output signals. One is modulated signal $I_{\tau 1+\tau 2}$ which is in phase and has delay $\tau_2$ time compared with $I_{\tau 1}$ and the other is modulated signal $Q_{\tau 1+\tau 2}$ which is in quadrature and has delay $\tau_2$ time compared with $I_{\tau 1}$. As shown in FIG. 4A, the in phase and delay $\tau_1$ time modulated signal $I_{\tau 1}$ is coupled to the multiplier stage 403 to multiply by the in quadrature and having delay $\tau_1+\tau_2$ time modulated signal $Q_{\tau 1+\tau 2}$ to generate an output signal M1. On the other hand, the in phase and having delay $\tau_1+\tau_2$ time modulated signal $I_{\tau 1+\tau 2}$ and the in quadrature and having delay , $\tau_1$ time modulated signal $Q_{\tau 1}$ are also multiplied together by the multiplier stage 404 to generate another output signal M2. Then, the two output signals M1 and M2 are subtracted from each other in the differential stage 405 to generate a signal D. Finally, a low pass filter 406 is used to filter out the noise of the signal D. It should be noted that the second order frequency does not exist in the phase of the signal demodulated by the demodulator of the present invention. Therefore, a high selectively low pass filter 406 is not needed. In other words, the slope of the frequency response curve need not be high. Consequently, it is not necessary to use the discrete devices to form the low pass filter 406. Therefore, all devices may be achieved in an integrated circuit to reduce the area required to form the demodulator.

As in the foregoing description, it is assumed that the signal input modulated signal is I:

$$I(t) = \epsilon_1 \sin(\omega t + \beta_F \sin pt) = \epsilon_1 \sin \alpha$$

$$\alpha = wt + \beta_F \sin pt$$

Then, a modulated signal $I_{\tau 1}$ which is in phase and delay $\tau_1$ time compared with I and a modulated signal $Q_{\tau 1}$ which is in quadrature and has delay $\tau_1$ time compared with I are generated after the single input modulated signal I passes through the I-Q splitter with constant group delay apparatus 401, wherein:

$$I_{\tau 1} \cong \sin[\alpha + \Phi(-\tau_1)]$$

$$Q_{\tau 1} \cong \sin[\alpha + \Phi(-\tau_1) + \pi/2] = \cos[\alpha + \Phi(-\tau_1)]$$

$$\alpha = wt + \beta_F \sin pt$$

Next, the modulated signal $I_{\tau 1}$ pass through the I-Q splitter with constant group delay apparatus 402 again to generate two modulated output signals. One is modulated signal $I_{\tau 1+\tau 2}$ which is in phase and delay $\tau_2$ time compared with $I_{\tau 1}$ and the other is modulated signal $Q_{\tau 1+\tau 2}$ which is in quadrature and has delay $\tau_2$ time compared with $I_{\tau 1}$, wherein:

$$I_{\tau 1-\tau 2} \cong \sin\{\alpha + \Phi[-(\tau_1+\tau_2)]\}$$

$$Q_{\tau 1+\tau 2} \cong \sin\{\alpha + \Phi[-(\tau_1+\tau_2)] + \pi/2\} = \cos\{\alpha + \Phi[-(\tau_1+\tau_2)]\}$$

$$\alpha = wt + \beta_F \sin pt$$

Then, the in phase and having delay $\tau_1$ time modulated signal $I_{\tau 1}$ is coupled to the multiplier stage 403 for multiplication by the in quadrature and having delay $\tau_1+\tau_2$ time modulated signal $Q_{\tau 1+\tau 2}$ to generate an output signal. On the other hand, the in phase and having delay $\tau_1+\tau_2$ time modulated signal $I_{\tau 1+\tau 2}$ and the in quadrature and having delay $\tau_1$ time modulated signal $Q_{\tau 1}$ are also multiplied together by the multiplier stage 404 to generate another output signal. Then, the two output signals are subtracted from each other in the differential stage 405 to generate the final demodulated signal. The following shows the result of the phase according to the foregoing description:

$$I_{\tau 1} \times Q_{\tau 1-\tau 2} - I_{\tau 1+\tau 2} \times Q_{\tau 1} = \sin[\alpha + \Phi(-\tau_1)] \times \cos\{\alpha + \Phi[-(\tau_1+\tau_2)]\} -$$

$$\sin\{\alpha + \Phi[-(\tau_1+\tau_2)]\} \times \cos[\alpha + \Phi(-\tau_1)]$$

$$= \sin\{\Phi(-\tau_1) - \Phi[-(\tau_1+\tau_2)]\}$$

wherein $$\alpha = wt + \beta_F \sin pt$$

From the above description, the second order frequency does not exist in the phase of the signal demodulated by the demodulator of the present invention. Therefore, a high selectivity low pass filter 406 is not required to eliminate the second order frequency. The main reason for using the low pass filter in the present invention is to filter high frequencies much larger than the second order frequency. Therefore, the slope requirement of the frequency response curve is not high. In other words, the purpose of forming integrated circuit may be achieved.

On the other hand, the quadrature and having delay $\tau_1$ time modulated signal $Q_{\tau 1}$ generated by the I-Q splitter with constant group delay apparatus 401 are also the input signal of the I-Q splitter with constant group delay apparatus 402. The following shows the formula:

$$I_{\tau 1} \cong \sin[\alpha + \Phi(-\tau_1)]$$

$$Q_{\tau 1} \cong \sin[\alpha + \Phi(-\tau_1) + \pi/2] = \cos[\alpha + \Phi(-\tau_1)]$$

$$\alpha = wt + \beta_F \sin pt$$

Next, the modulated signal $Q_{\tau 1}$ passes through the I-Q splitter with constant group delay apparatus 402 again to generate two modulated output signals. One is modulated signal $I_{\tau 1+\tau 2}$ which is in phase and delay $\tau_2$ time compared with $Q_{\tau 1}$ and the other is modulated signal $Q_{\tau 1+\tau 2}$ which is quadrature and delay $\tau_2$ time compared with $Q_{\tau 1}$, wherein:

$$I_{\tau 1-\tau 2} \cong \cos\{\alpha + \Phi[-(\tau_1+\tau_2)]\}$$

$$Q_{\tau 1+\tau 2} \cong \cos\{\alpha + \Phi[-(\tau_1+\tau_2)] + \pi/2\} = -\sin\{\alpha + \Phi[-(\tau_1+\tau_2)]\}$$

$$\alpha = wt + \beta_F \sin pt$$

Then, the quadrature and having delay $\tau_1$ time modulated signal $Q_{\tau 1}$ is coupled to the multiplier stage 403 for multiplication by the in phase and having delay $\tau_1+\tau_2$ time modulated signal $I_{\tau 1+\tau 2}$ to generate an output signal. On the other hand, the quadrature and having delay $\tau_1+\tau_2$ time $Q_{\tau 1+\tau 2}$ and the in phase and having delay $\tau_1$ time modulated signal $I_{\tau 1}$ are also multiplied together by the multiplier stage 404 to generate another output signal. Then, the two output signals are subtracted from each other in the differential stage 405 to generate the final demodulated signal. The following shows the result of the phase according to the foregoing description:

$$Q_{\tau 1} \times I_{\tau 1-\tau 2} - Q_{\tau 1+\tau 2} \times I_{\tau 1} = \cos[\alpha + \Phi(-\tau_1)] \times \cos\{\alpha + \Phi[-(\tau_1+\tau_2)]\} +$$

$$\sin\{\alpha + \Phi[-(\tau_1+\tau_2)]\} \times \sin[\alpha + \Phi(-\tau_1)]$$

$$= \cos\{\Phi(-\tau_1) - \Phi[-(\tau_1+\tau_2)]\}$$

wherein $$\alpha = wt + \beta_F \sin pt$$

Similarly, from the above description, although the I-Q splitter with constant group delay apparatus 402 uses the quadrature and having delay $\tau_1$ time modulated signal $Q_{\tau 1}$ generated by the I-Q splitter with constant group delay apparatus 401 as the input signal, the final demodulated output signal also does not have the second order frequency. Therefore, it is not also necessary to use a high selectivity low pass filter 406 to eliminate the second order frequency.

Figure 4B:
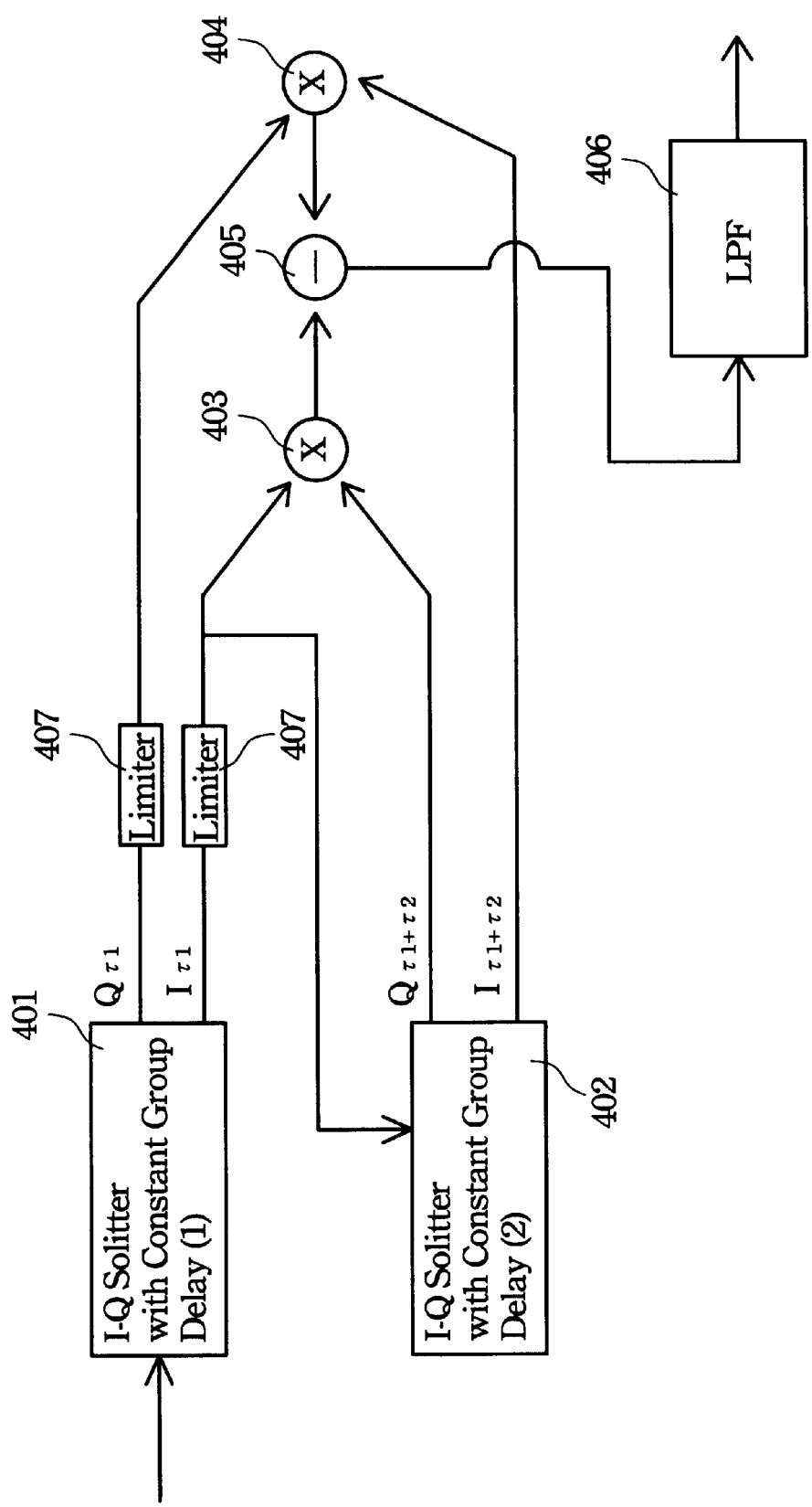

On the other hand, although the amplitude of the input modulated signal "I" is constant, it causes variation of the amplitude because of signal decay, environmental noise and interference. The variation affects the quality of the final demodulated signal. Therefore, if a high quality demodulated signal is required, it is helpful to add a limiter into the demodulating circuit to eliminate the variation of the modulated signal. This is shown in FIG. 4B.

Figure 5:
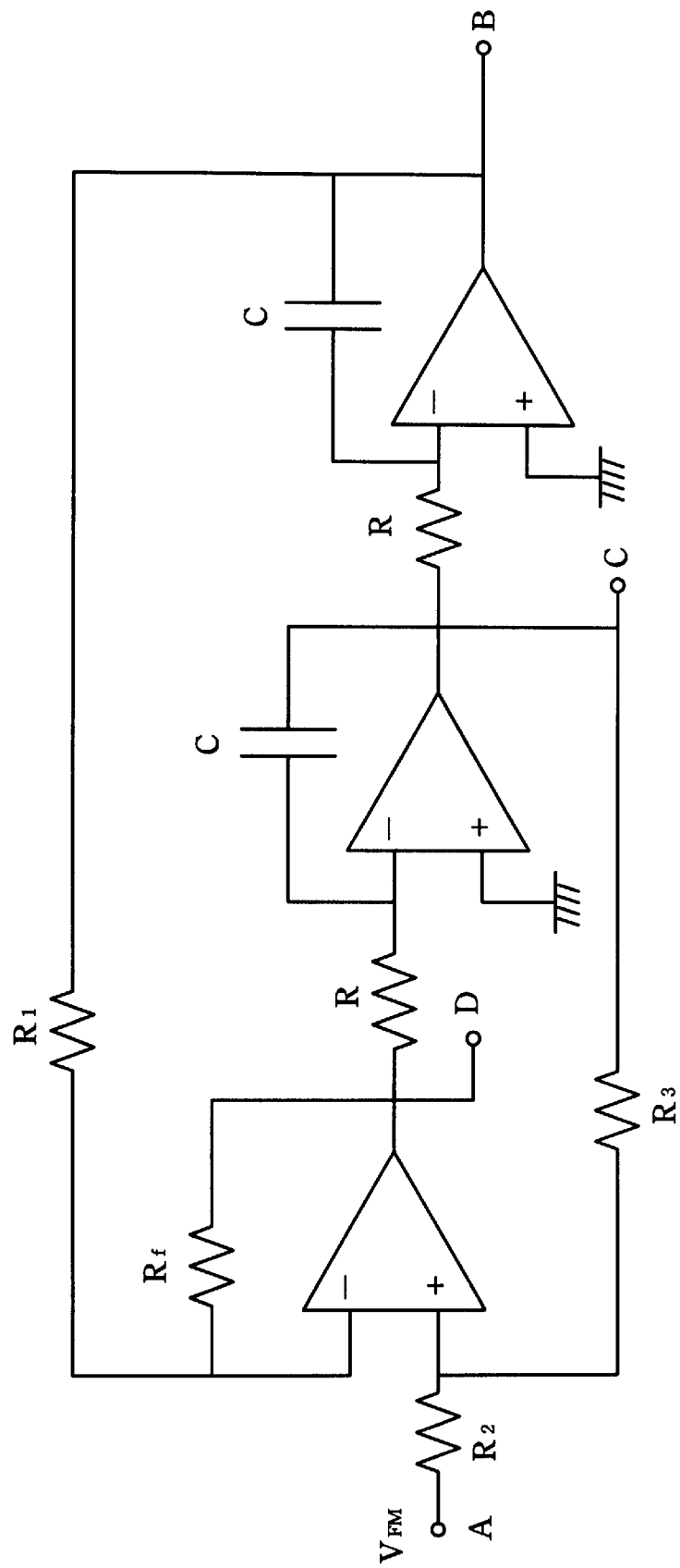
FIG. 5 illustrates a circuit diagram of the I-Q splitter with constant group delay apparatus according the preferred embodiment of the present invention.

FIG. 5 it shows a second order filter circuit that is used as the I-Q splitter with constant group delay apparatus by the preferred embodiment of the present invention. It is noted that the foregoing second order filter is not the only circuit framework of the I-Q splitter with constant group delay apparatus.

In accordance with the spirit of this invention, if a circuit may receive a input modulated signal and then generate two output modulated signals, where one in phase and has an interval of time delay and the other is in quadrature and has an interval of time delay compared with the input modulated signal, this circuit should be included in the claims of the present invention. The delay time depends on the design of the circuit.

This second order filter may be used as a high pass filter, a band pass filter and a low pass filter. As shown in the FIG. 5, if the input signal is received by point A and the output signal is drawn from point B, the second order filter is used as a low pass filter. If the input signal is received by point A and the output signal is drawn from point C, the second order filter is used as a band pass filter. If the input signal is received by point A and the output signal is drawn from point D, the second order filter is used as a high pass filter.

The transfer function of the second order filter is shown as follows:

$$T(s) = \frac{n_2 s^2 + n_1 s + n_0}{s^2 + s(w_0/Q) + w_0^2}$$

When $n_1$ and $n_2$ are zero, a low pass filter transfer function is indicated. When $n_0$ and $n_2$ are zero, a band pass filter transfer function is indicated. When $n_1$ and $n_0$ are zero, a high pass filter transfer function is indicated.

It is assumed that the second order filter is used as a low pass filter. During operation at nature frequency ($W_0$), the transfer function of the low pass filter is the following formula:

$$T(s) = \frac{n_0}{s(w_0/Q)}$$

Because of the S value, the output signal drawn from the Point B has a 90-degree phase shift compared with the input signal.

Similarly, it is assumed that the second order filter is used as a band pass filter. During operation at nature frequency ($W_0$), the transfer function of the band pass filter is the following formula.

$$T(s) = \frac{n_1 s}{s(w_0/Q)} = \frac{n_1}{(w_0/Q)}$$

The output signal drawn from point C does not have any phase shift compared with the input signal. That is, the input signal and the output signal are in phase.

Therefore, the present invention utilizes this characteristic of the second order filter, drawing out an in phase output signal from point C and a quadrature output signal from the Point B. However, the circuit design of the second order filter, causes the output signals, in phase and quadrature, to have an interval of delay time.

According to the foregoing description, the demodulator of the present invention only requires one modulated input signal to perform the demodulating process. Therefore, only one circuit is required to handle the modulated signal before the demodulator begins to process the signal, which may save power.

On the other hand, the demodulator of the present invention does not generate an output signal having the second order frequency component in the phase. Therefore, it is not necessary to uses a low pass filter having high selectivity to filter out the frequency. In other words, all demodulation devices and the low pass filter may be combined into an integrated circuit according to the present invention to conserve overall area.

As understood by a person skilled in the art, the foregoing preferred embodiments of the present invention are illustrative of the present invention rather than limiting of the present invention. The present invention is intended to cover various modifications and similar arrangements. For example, this kind of second order filter circuit design of the I-Q splitter with constant group delay apparatus may use other types of circuit design as long as the circuit may receive a input modulated signal and then generate two output modulated signals, one in phase and having an interval of time delay and the other quadrature and having an interval of time delay compared with the input modulated signal. All these are included within the spirit and scope of the appended claims, the scope of which should be accorded the broadest interpretation so as to encompass all such modifications and similar structure.

What is claimed is:

1. An FM demodulator using a single input signal apparatus, comprising:
   a first I-Q splitter with a constant group delay apparatus receiving the input signal to generate a first in phase output signal and a first quadrature output signal;
   a second I-Q splitter with a constant group delay apparatus receiving said first in phase output signal to generate a second in phase output signal and a second quadrature output signal;
   a first multiplier stage receiving said first in phase output signal and said second quadrature output signal to generate a first output signal;
   a second multiplier stage receiving said first quadrature output signal and said second in phase output signal to generate a second output signal;
   a differential stage receiving said first output signal and said second output signal to generate a third output signal; and
   a low pass filter receiving said third output signal to generate a demodulated signal.

2. The FM demodulator using a single input signal apparatus of claim 1, wherein said first in phase output signal is a signal in phase and having an interval of delay time compared with said input signal.

3. The FM demodulator using a single input signal apparatus of claim 1, wherein said first quadrature output signal is a signal in quadrature and having an interval of delay time compared to said input signal.

4. The FM demodulator using a single input signal apparatus of claim 1, wherein said second in phase output signal is a signal in phase and having an interval of delay time compared with said first in phase output signal.

5. The FM demodulator using a single input signal apparatus of claim 1, wherein said second quadrature output signal is a signal in quadrature and having an interval of delay time compared with said first in phase output signal.

6. The FM demodulator using a single input signal apparatus of claim 2, wherein a length of said an interval of delay time depends on a design of said first and second I-Q splitter with constant group delay apparatuses.

7. The FM demodulator using a single input signal apparatus of claim 1, further comprising a first limiter to receive said first quadrature output signal to eliminate noise of said first quadrature output signal.

8. The FM demodulator using a single input signal apparatus of claim 1, further comprising a second limiter to receive said first in phase output signal to eliminate noise of said first in phase output signal.

9. A FM demodulator using a single input signal apparatus, comprising:
 a first I-Q splitter with constant group delay apparatus receiving an input signal to generate a first in phase output signal and a first quadrature output signal;
 a second I-Q splitter with a constant group delay apparatus receiving said first quadrature output signal to generate a second in phase output signal and a second quadrature output signal;
 a first multiplier stage receiving said first in phase output signal and said second quadrature output signal to generate a first output signal;
 a second multiplier stage receiving said first quadrature output signal and said second in phase output signal to generate a second output signal;
 a differential stage receiving said first output signal and said second output signal to generate a third output signal; and
 a low pass filter receiving said third output signal to generate a demodulated signal.

10. The FM demodulator using a single input signal apparatus of claim 9, wherein said first in phase output signal is a signal in phase and having an interval of delay time compared with said input signal.

11. The FM demodulator using a single input signal apparatus of claim 9, wherein said first quadrature output signal is a signal in quadrature and having an interval of delay time compared with said input signal.

12. The FM demodulator using a single input signal apparatus of claim 9, wherein said second in phase output signal is a signal in phase and having an interval of delay time compared with said first quadrature output signal.

13. The FM demodulator using a single input signal apparatus of claim 9, wherein said second quadrature output signal is a signal in quadrature and having an interval of delay time compared with said first quadrature output signal.

14. The FM demodulator using a single input signal apparatus of claim 10, wherein a length of said interval of delay time depends on a design of said first and second I-Q splitter with constant group delay apparatuses.

15. The FM demodulator using a single input signal apparatus of claim 9, further comprising a first limiter to receive said first in phase output signal to eliminate noise of said first in phase output signal.

16. The FM demodulator using a single input signal apparatus of claim 9, further comprising a second limiter to receive said first quadrature output signal to eliminate noise of said first quadrature output signal.

17. A demodulating method using a single input signal, comprising the steps of:
 using a first I-Q splitter with a constant group delay apparatus receiving the input signal to generate a first output signal and a second output signal;
 using a second I-Q splitter with a constant group delay apparatus receiving said first output signal to generate a third output signal and a fourth output signal;
 multiplying said first output signal by said third output signal to generate a fifth output signal;
 multiplying said second output signal by said fourth output signal to generate a sixth output signal; and
 subtracting from said sixth output signal and fifth output signal to generate a demodulating signal.

18. The demodulating method of claim 17, wherein said first and second I-Q splitter with constant group delay apparatuses may transfer input signal to two output signals, compared with input signal, one signal being in phase and having an interval delay time and the other in quadrature and having an interval delay time.

19. The demodulating method of claim 17, wherein said first output signal is a signal in phase and having an interval of delay time compared with said input signal.

20. The demodulating method of claim 17, wherein said second output signal is a signal in quadrature and having an interval of delay time compared with said input signal.

21. The demodulating method of claim 19, wherein said third output signal is a signal in quadrature and having an interval of delay time compared with said first output signal.

22. The demodulating method of claim 19, wherein said fourth output signal is a signal in phase and having an interval of delay time compared with said first output signal.

23. The demodulating method of claim 17, wherein said first output signal is a signal in quadrature and having an interval of delay time compared with said input signal.

24. The demodulating method of claim 17, wherein said second output signal is a signal in phase and having an interval of delay time compared with said input signal.

25. The demodulating method of claim 23, wherein said third output signal is a signal in phase and having an interval of delay time compared with said first output signal.

26. The demodulating method of claim 23, wherein said fourth output signal is a signal in quadrature and having an interval of delay time compared with said first output signal.

27. The demodulating method of claim 19, wherein a length of said an interval of delay time depends on a design of said first and second I-Q splitter with constant group delay apparatuses.

28. The demodulating method of claim 17, further comprising a first limiter to receive said second output signal to eliminate noise of said second output signal.

29. The demodulating method of claim 17, further comprising a second limiter to receive said first output signal to eliminate noise of said first output signal.

30. The demodulating method of claim 17, further comprising a low pass filter to receive the demodulating signal.

* * * * *